United States Patent
Shiao et al.

[19]

[11] Patent Number: 6,107,193
[45] Date of Patent: Aug. 22, 2000

[54] COMPLETELY REMOVAL OF TIN RESIDUE ON DUAL DAMASCENCE PROCESS

[75] Inventors: G. S. Shiao; Min-Liang Chen, both of Hsinchu; Wei-Jing Wen, Taipei, all of Taiwan

[73] Assignee: Mosel Vitelic Inc., Hsinchu, Taiwan

[21] Appl. No.: 09/022,840

[22] Filed: Feb. 12, 1998

[30] Foreign Application Priority Data

Dec. 19, 1997 [TW] Taiwan ................................. 86119299

[51] Int. Cl.$^7$ ........................ H01L 21/4763; H01L 21/44
[52] U.S. Cl. .......................... 438/648; 438/648; 438/647; 438/669
[58] Field of Search ..................... 438/647, 648, 438/669, 645

[56] References Cited

U.S. PATENT DOCUMENTS 5,770,519   6/1998   Klein et al. .
5,776,833   7/1998   Chen et al. .

Primary Examiner—John F. Niebling
Assistant Examiner—Josetta Jones
Attorney, Agent, or Firm—Bacon & Thomas

[57] ABSTRACT

A process for completely removing TiN residue existing outside contact windows is described: electrical elements are formed on a silicon substrate, an insulating layer is then formed over the entire silicon substrate, next, the insulating layer is partially etched to form metal contact windows, a TiN barrier layer and a tungsten metal layer are then sequentially deposited overlaying the insulating layer and filling into the metal contact windows, two stage CMP process is performed to remove the metal and TiN barrier layers exposed outside the contact windows respectively, finally, an dry etching step employing HCl/Cl$_2$ plasmas is performed to make sure there is not any TiN residues left outside contact windows.

8 Claims, 3 Drawing Sheets

COMPLETELY REMOVAL OF TIN RESIDUE ON DUAL DAMASCENCE PROCESS

BACKGROUND OF THE INVENTION

(1) Field of the Invention

This invention relates generally to the field of integrated circuits (ICs) fabrication, and more particularly, to a process of forming metal wires without the concerns of electrical short problem.

(2) Description of the Prior Art

In order to form compact and high density devices, multiple layers of conductors and insulators are stacked within the limited area in IC fabrication. It tends to have steep and complicated topography on the wafer surfaces. As the size of the contact hole is reduced, metals are not well filled in the contact hole during the metal contact process, therefore, there occurs a problem that the contact resistance is increased or even became open circuit. In general, aluminum, which has high conductivity, is widely used as a metal conductor in the metal contact process. However, aluminum cannot satisfactorily fill inside the contact hole of small size due to its poor step coverage characteristics. As a solution to solve such problem, first inside the contact hole is filled by a metal of excellent step coverage characteristics, and then metal wiring is formed by an aluminum deposition and patterning. Tungsten is mainly used to fill the contact hole because of its excellent step coverage characteristics. Tungsten is an high resistant metal with a high melting point and has the advantage in that is has excellent thermal stability with silicon and also has low electrical specific heat.

Referring now to FIGS. 1(*a*) to 1(*b*), there are top views of the metal short illustrations according to the conventional contact hole process. First, electrical elements such as MOSFETs are fabricated on a P-type semiconductor silicon wafer. Then, an insulating layer is formed over the entire wafer. Next, the insulating layer is partially etched to form metal contact windows by the conventional lithography and plasma etching techniques. A TiN barrier layer and a tungsten metal layer are then sequentially deposited overlaying the insulating layer and filling into the metal contact windows. Next, chemical mechanical polishing (CMP) process is performed to remove the metal and TiN barrier layers exposed outside the contact windows. As the spacing between two metal wires 1 continuously shrinking (about 0.17 μm in today's technology), TiN barrier residues 3 are very difficult to be removed completely by CMP. Therefore, these TiN barrier residues 3 will short 5 the metal wiring, particularly around narrow corner area 7 as shown in both FIGS. 1(*a*) and 1(*b*), thereby, degrading the reliability of the integrated circuit devices.

This invention reveals an improved process of tungsten plug etching for contact windows to eliminate the above mentioned metal wiring short problem.

SUMMARY OF THE INVENTION

Accordingly, it is a primary object of the present invention to provide a process for metal wire formation without the concerns of electrical short problem in an integrated circuit.

It is another object of the present invention provide a process for metal wire formation, that can efficiently removing TiN residue existing outside contact windows, and therefore improves the yields and stability of the integrated circuit devices.

It is a further object of the present invention provide a TiN etching recipe that has excellent selectivity with respect to oxide and tungsten.

These objects are accomplished by the fabrication process described below.

First, electrical elements such as MOSFETs are fabricated on a P-type semiconductor silicon substrate. Then, an insulating layer is formed over the entire silicon substrate. Next, the insulating layer is partially etched to form metal contact windows by the conventional lithography and plasma etching techniques. A TiN barrier layer and a tungsten metal layer are then sequentially deposited overlaying the insulating layer and filling into the metal contact windows. Next, two stage CMP process is performed to remove the metal and TiN barrier layers exposed outside the contact windows respectively. Finally, an extra plasma etching step is performed to make sure there is not any TiN residues left outside contact windows. The step is the key point of the present invention that has excellent selectivity of TiN with respect to oxide and tungsten to prevent the potential metal short problem of the conventional process. The process for complete TiN residue removal according to the present invention is accomplished.

BRIEF DESCRIPTION OF THE DRAWINGS

The accompanying drawings forming a material part of this description, in which.

DESCRIPTION OF THE PREFERRED EMBODIMENTS

Figure 1A:
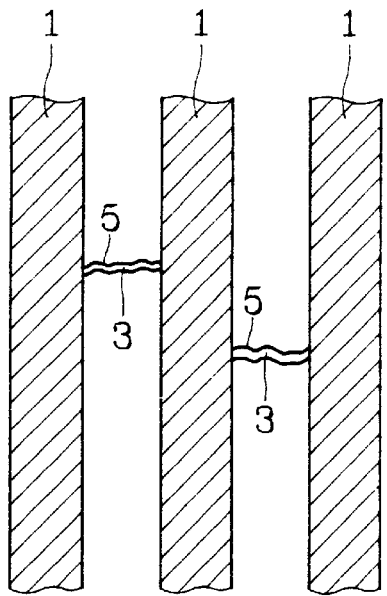
FIGS. 1(*a*) and 1(*b*) show top views of the metal short illustrations according to the conventional contact hole process.
Figure 1B:
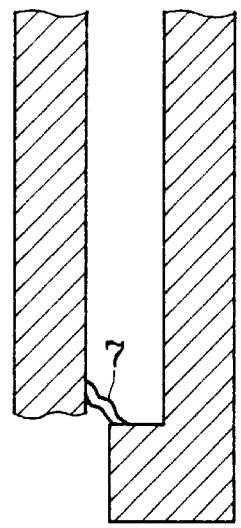

The invention discloses herein is directed to a metal wire process which can completely remove TiN residues outside contact windows. The drawing figures are illustrated a partially completed silicon substrate. In the following description, numerous details are set forth in order to provide a thorough understanding of the present invention. It will be appreciated by one skilled in the art that variations of these specific details are possible while still achieving the results of the present invention. In other instance, well-known processing steps are not described in detail in order not to unnecessarily obscure the present invention.

Figure 2:
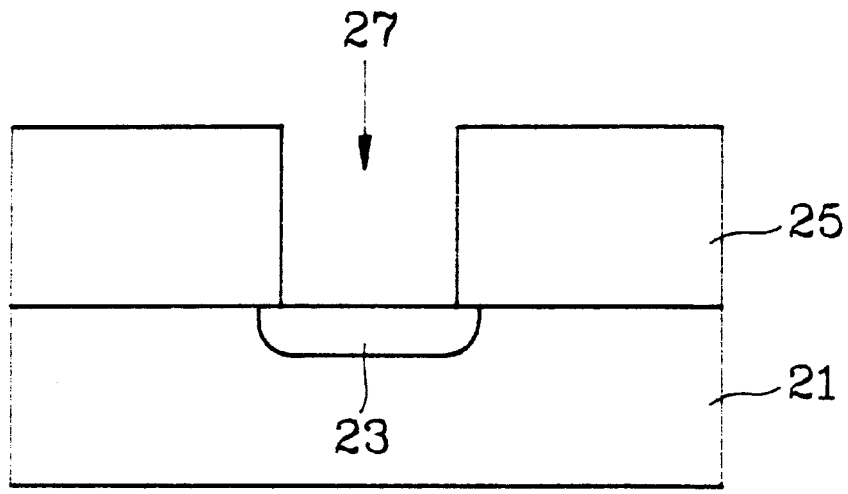
FIG. 2 shows a cross sectional representation of a substrate after a contact window is formed according to the present invention.

Referring now more particularly to FIG. 2, there is shown a portion of partially completed Metal-Oxide-Semiconductor Field Effect Transistor (MOSFET). A MOSFET region is usually consist of a gate oxide layer, gate electrodes, pad oxides, lightly doped drains, spacers, source and drain areas. For simplicity reason, FIG. 2 only shows the source/drain region 23 of a MOSFET which is fabricated on a P-type semiconductor silicon substrate 21. Then, an insulating layer 25 is formed over the entire silicon substrate 21. Next, the insulating layer 25 is partially etched to form contact windows 27 which are electrically contacted with the source/drain regions 23 by the conventional lithography and plasma etching techniques as shown in FIG. 2.

The insulating layer 25 is usually using plasma enhanced chemical vapor deposited (PECVD) silane (PE-SiH$_4$) with a thickness of about 3000 to 6000 Angstroms. Alternatively, the insulating layer 25 can be other types of silicon dioxide such as boronphosphosilicate glass (BPSG). The plasma etching process can use magnetic enhanced reactive ion etching (MERIE), electron cyclotron etching (ECR) or reactive ion etching (RIB) methods with reactant gases of CF$_4$,CHF$_3$ and O$_2$.

Figure 3:
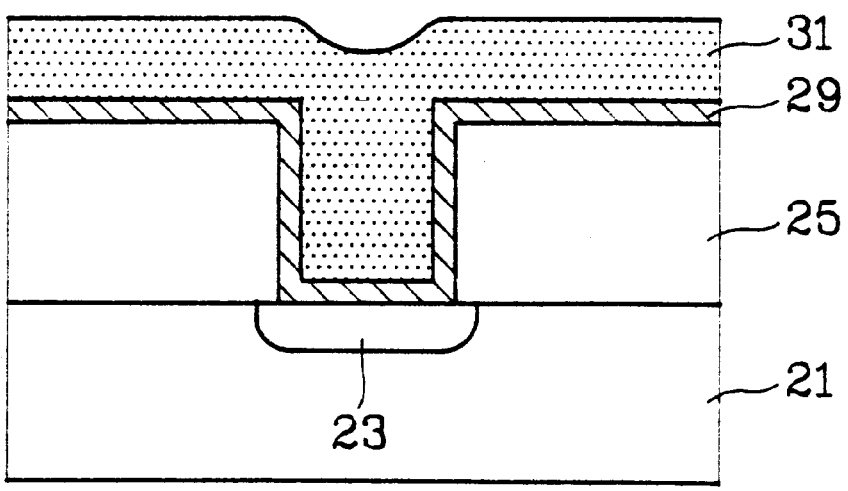
FIG. 3 shows a cross sectional representation of a substrate after the tungsten layer is deposited according to the present invention.

Referring now to FIG. 3, a TiN barrier layer 29 and a metal layer 31 are sequentially deposited overlaying the insulating layer and filling into the contact windows. The TiN barrier layer 29 is usually formed by sputtering to a thickness of about 200 to 500 Angstroms. The metal layer is usually composed of tungsten (W) which is formed by CVD with reactant gases of SF$_6$ and SiH$_4$ to a thickness of about 3000 to 8000 Angstroms.

Figure 4:
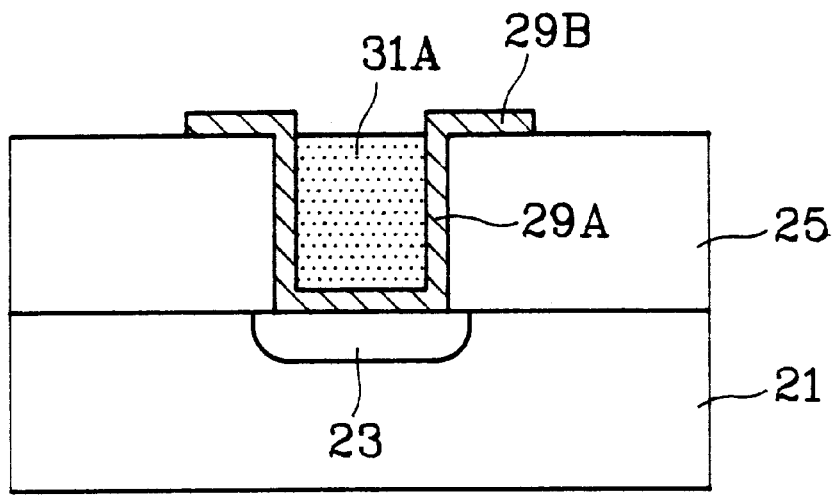
FIG. 4 shows a cross sectional representation of a substrate after CMP is performed according to the present invention.

Referring now to FIG. 4, two stage CMP process is performed to remove the metal and TiN barrier layers exposed outside the contact windows. The first stage CMP which mainly removes most of tungsten metal and a portion of TiN barrier layer is using slurry solution consisting of silica and alumina suspended in NH$_4$OH or KOH. The second stage CMP which removes a small portion of the insulating layer as well as the remaining of TiN barrier layer 29B outside contact window is using slurry of water and SC-E together with Embossed Politex polishing pad.

Figure 5:
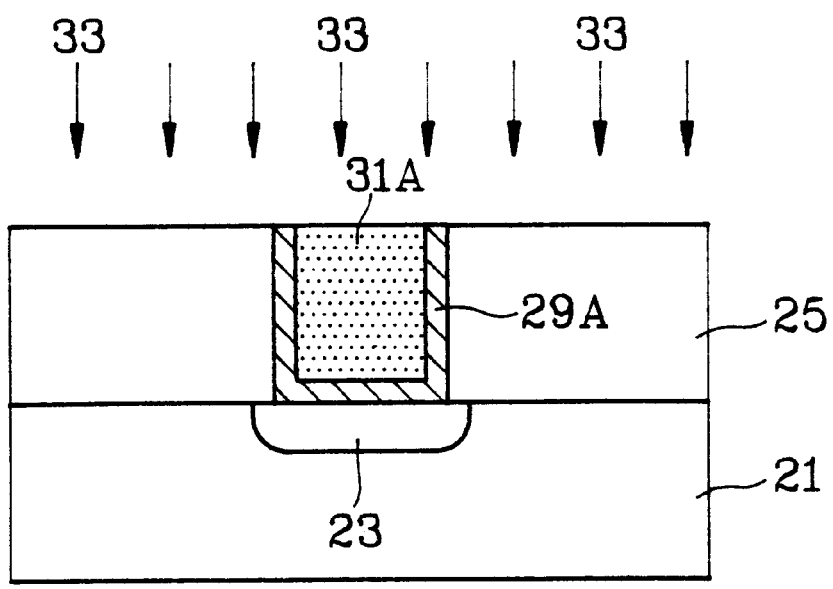
FIG. 5 shows a cross sectional representation of a substrate after the plasma etching is performed to completely remove any TiN residue outside contact window according to the present invention.

Referring now to FIG. 5, since TiN residues may still exit due to the fact that the substrate surface is not perfect flat and narrow spacing between metal wires, an extra plasma etching 33 step is performed to make sure there is not any TiN residues left outside contact windows. The step is the key point of the present invention that prevents the potential metal short problem of the conventional process. The process for complete TiN residue removal according to the present invention is accomplished.

The TiN plasma etching step of the present invention is operated in a mixture of HCl and Cl$_2$ plasmas environment with HCl to Cl$_2$ gas ratio of between 1:2 and 1:5 for a time between 13 to 20 seconds. This particular etching recipe can effectively remove TiN without damaging unprotected tungsten and underlaying oxide layers. Therefore, excellent end point control ability for this etching process can be achieved.

While the invention has been particularly shown and described with reference to a preferred embodiment, it will be understood by those skilled in the art that various changes in form and detail may be made therein without departing from the spirit and scope of the present invention.

What is claimed is:

1. A process of completely TiN residue removal outside contact windows for integrated circuits fabrication, comprising the steps of:

(a) forming an insulating layer on a substrate, said substrate having predefined integrated circuits, and then partially etching said insulating layer to form contact windows;

(b) forming a TiN barrier layer overlaying said insulating layer and filling into said contact windows;

(c) forming a metal layer overlaying said TiN barrier layer and filling into said contact windows;

(d) performing first chemical mechanical polishing (CMP) to initially remove said metal and TiN barrier layer, wherein said TiN barrier layer has TiN residues left outside said contact windows;

(e) performing second CMP to further remove TiN residues exposed outside said contact windows; and (f) performing dry etching to completely remove any said TiN residues still left outside said contact windows, wherein said dry etching comprising of HCl and Cl$_2$ plasmas.

2. The method of claim 1, wherein said insulating layer is plasma enhanced chemical vapor deposited silane (PE-SiH$_4$).

3. The method of claim 1, wherein said insulating layer has a thickness of between about 3000 to 6000 Angstroms.

4. The method of claim 1, wherein said TiN barrier layer has a thickness of between about 200 to 500 Angstroms.

5. The method of claim 1, wherein said metal layer has a thickness of between about 3000 to 8000 Angstroms.

6. The method of claim 1, wherein said metal layer is an alloy composed of tungsten (W).

7. The method of claim 1, wherein said HCl and Cl$_2$ plasmas has a gas ratio between 1:2 and 1:5.

8. The method of claim 1, wherein said dry etching is performed between about 13 to 20 seconds.

* * * * *